United States Patent [19]
Shinozaki et al.

[11] Patent Number: 5,995,199
[45] Date of Patent: Nov. 30, 1999

[54] POSITION MEASUREMENT METHOD FOR MEASURING A POSITION OF AN EXPOSURE MASK AND EXPOSURE METHOD FOR TRANSFERRING AN IMAGE OF THE PATTERN FORMED IN AN EXPOSURE MASK

[75] Inventors: Tadaaki Shinozaki, Kawasaki; Nobutaka Fujimori, Fujisawa; Toshio Matsuura, Tokyo; Toshinobu Morioka, Fujisawa, all of Japan

[73] Assignee: Nikon Corporation, Tokyo, Japan

[21] Appl. No.: 08/877,998

[22] Filed: Jun. 18, 1997

[30] Foreign Application Priority Data

Jun. 26, 1996 [JP] Japan .................................. 8-185610

[51] Int. Cl.[6] .......................... G03B 27/42; G03B 27/32; G03F 9/00
[52] U.S. Cl. .................................. 355/53; 430/22; 355/77
[58] Field of Search ................................. 355/52, 53, 55, 355/67, 77; 356/399, 400, 401; 250/548; 430/5, 22, 30

[56] References Cited

U.S. PATENT DOCUMENTS

| | | | |
|---|---|---|---|
| 4,962,318 | 10/1990 | Nishi | 250/548 |
| 5,418,613 | 5/1995 | Matsutani | 356/401 |
| 5,442,418 | 8/1995 | Murakami et al. | 355/53 |
| 5,464,715 | 11/1995 | Nishi et al. | 430/22 |
| 5,543,256 | 8/1996 | Shinoda et al. | 430/22 |
| 5,751,404 | 5/1998 | Murakami et al. | 355/53 |
| 5,753,926 | 5/1998 | Sato | 250/548 |
| 5,773,180 | 6/1998 | Tomimatu | 430/22 |

*Primary Examiner*—Safet Metjahic
*Assistant Examiner*—Hung Henry Nguyen
*Attorney, Agent, or Firm*—Nixon & Vanderhye P.C.

[57] ABSTRACT

Positions of a plurality of marks formed in a correction mask are measured as first positions. A plurality of marks in the correction mask are transferred onto a photosensitive substrate, and transferred positions of the plurality of marks are determined as second positions. Subsequently, amounts of deviation of the first positions from the second positions are determined as correction data. After that, positions of a plurality of marks formed in an exposure mask are measured as third positions by a method similar to that used for measurement of the first positions, and the third positions are corrected on the basis of the correction data.

14 Claims, 10 Drawing Sheets

POSITION MEASUREMENT METHOD FOR MEASURING A POSITION OF AN EXPOSURE MASK AND EXPOSURE METHOD FOR TRANSFERRING AN IMAGE OF THE PATTERN FORMED IN AN EXPOSURE MASK

BACKGROUND OF THE INVENTION

The present invention relates to an exposure method for transferring an image of a pattern formed in a mask onto a photosensitive substrate through a projection optical system.

As an exposure apparatus for transferring an image of a pattern formed in a mask onto a photosensitive substrate, various types of apparatus have been developed. For example, as a projection exposure apparatus for production of a liquid crystal display (LCD), many step-and-repeat type apparatus (hereinafter, referred to as "stepper") are being used. In such a stepper, after a predetermined area of a substrate is exposed to a pattern of an LCD formed in a mask, a stage on which the substrate is placed is shifted a predetermined distance in a stepping manner to perform exposure of another area of the substrate. Such an operation is repeatedly performed on the entire area on the substrate to complete exposure of the entire substrate. Normally in this stepper, an LCD pattern is formed by a picture composition method. That is, four exposed patterns 100a, 100b, 100c, 100d on a substrate are combined, as indicated in FIG. 13, thereby forming a single LCD pattern on the substrate. Each of the patterns 100a, 100b, 100c, 100d corresponds to a different mask. That is, the patterns 100a, 100b, 100c, 100d are sequentially formed by exposure while one of the four masks is sequentially replaced by another mask. The four patterns are then combined into an LCD.

In exposure using such a picture composition method, a positional deviation of a transferred pattern 112 may sometimes occur as indicated in FIGS. 14(*a*)–(*c*). In the drawings, dotted lines indicate a desired transfer position, and solid lines indicate transferred positions that have errors. As positional deviations at the time of pattern transfer, there are: (a) a positional deviation wherein a transferred pattern 112 has a shift error; (b) a positional deviation wherein a transferred pattern 112 has a rotational error; and (c) a positional deviation wherein a transferred pattern 112 has a magnification error. Since an LCD is formed normally by superimposing about seven to eight layers on a glass substrate, an error as mentioned above can be a cause for an overlay deviation between layers. In a TFT (thin film transistor) LCD, a positional deviation at a stitching 110 (see FIG. 13) or an overlay deviation between layers degrades characteristics of transistors and causes defects such as color irregularity or the like. As factors that cause errors as indicated in FIGS. 14(*a*)–(*c*), optical aberrations, such as distortion, in the projection optical system, mask alignment errors, mask patterning errors, and the like can be considered.

Several methods for solving these problems have now been proposed. For example, as shown in FIG. 15, a plurality of coordinate measurement marks (126a, 126b, 126c, 126d, 126e, 126f, 126g, 126h) are arranged around an LCD pattern 122 within an effective exposure area 124 on a mask 120, and coordinates of the images transferred from the coordinate measurement marks (126a–126h) onto a substrate through a projection optical system are measured using a predetermined position detection device provided in the apparatus. From the amount of deviation between measured values and desired values of coordinates where these marks (126a–126h) are transferred, a correction value (a mask shift, a mask rotation, a magnification) that minimizes the amount of deviation is calculated by means of, for example, least square approximation or the like. After that, using the thus-calculated correction value, the mask 120 is precisely aligned, and then exposure is performed. Such a method can optimize a positional deviation of transfer caused by a patterning error of the mask 120 and an optical aberration of the projection optical system, and can reduce the positional deviation at stitchings and the overlay deviation between layers.

In the conventional methods as described above, however, there is a possibility that when coordinates, on a substrate, of the images of the coordinate measurement marks (126a–126h) in the mask 120 are detected by a position detection device, a deviation may occur between a detected coordinate and the actual transferred position on the substrate. This problem becomes serious especially in a case where images of reference marks provided on a stage, at substantially the same height as a substrate surface, are reversely projected onto a mask through a projection optical system, and coordinates at which the reference mark images superimpose on the coordinate measurement marks (126a–126h) are measured by a predetermined sensor, which coordinates are determined as positions at which the coordinate measurement marks (126a–126h) are transferred onto the substrate. More specifically, variations in optical aberrations, such as curvature of image field and the like, due to variations in the projecting direction in the projection optical system, cause deviations between imaginary transfer positions determined by the above-described method and the actual transferred positions on the substrate. Therefore, an error becomes included in a correction value that is calculated from a difference between a measured value of mask position provided by the position detection device and a desired value of position where an image is transferred, thereby making it impossible to properly correct the mask position, the magnification of the projection optical system, or the like, at the time of exposure. As a result, the positional deviation at stitchings of the exposed LCD screens or the overlay deviation between layers is not improved, and may be degraded.

SUMMARY OF THE INVENTION

The present invention has been accomplished in view of the circumstances as described above. It is an object of the invention to provide a position measurement method that can more accurately measure position of a mask. Another object of the invention is to provide an exposure method that can perform high-precision exposure by more accurate position alignment of a mask.

To solve the aforementioned problems, according to a first aspect of the present invention, a position measurement method is provided for measuring a position of an exposure mask prior to transfer of an image of a pattern formed in the exposure mask onto a photosensitive substrate through a projection optical system. Using a correction mask different from the exposure mask, a position of a plurality of marks formed in the correction mask is measured as a first position. A plurality of marks in the correction mask are transferred onto the photosensitive substrate, and a transferred position of the plurality of marks is determined as a second position. An amount of deviation of the first position from the second position is determined as a correction data, and a position of a plurality of marks formed in the exposure mask is measured as a third position by a method similar to that used for measurement of the first position. Finally, the third position is corrected on the basis of the correction data.

In a method as described above, the correction data may be stored as a correction map corresponding to a position of each of the plurality of marks formed in the correction mask. In this case, if correction data corresponding to a mark formed in the exposure mask does not exist in the correction map, the correction data may be calculated using a plurality of correction data near that mark in question, within the correction map. Furthermore, measurement of the first and third positions may be performed by photoelectrically detecting, on the correction and exposure mask sides, an image of a pattern formed in the photosensitive substrate side through the projection optical system.

According to a second aspect of the present invention, an exposure method is provided for transferring an image of a pattern formed in an exposure mask onto a photosensitive substrate through a projection optical system. Using a correction mask different from the exposure mask, a position of a plurality of marks formed in the correction mask is measured as a first position. A plurality of marks in the correction mask are transferred onto the photosensitive substrate, and a transferred position of the plurality of marks is determined as a second position. An amount of deviation of the first position from the second position is determined as a correction data, and a position of a plurality of marks formed in the exposure mask is measured as a third position by a method similar to that used for measurement of the first position. The third position is then corrected on the basis of the correction data. The exposure mask is positioned on the basis of the third position thus corrected, and an image of a pattern of the exposure mask thus positioned is transferred onto the photosensitive substrate through the projection optical system.

In accordance with the method of the invention, a position of the plurality of marks formed in the correction mask is first measured as the first position using a predetermined measurement device. Subsequently, the plurality of marks in the correction mask are transferred onto the photosensitive substrate, and the transferred position of the plurality of marks is determined as the second position. It is then determined as a correction data how much the first position of the marks measured by the measurement device deviates from the second position of the marks determined based on transferred images. Since a correction data is determined with reference to the second position determined based on transferred images, it becomes possible to obtain a correction data corresponding to the conditions at the time of actual exposure. That is, the correction data is not affected by changes in optical aberrations such as curvature of image field, and the like, which are caused by variations in the projecting direction through the projection optical system.

After that, a position of a plurality of marks formed in the exposure mask is measured as the third position. The third position is then corrected on the basis of the correction data previously determined. Based on such precise correction data, positional alignment of the exposure mask is performed, so that the positional deviation at stitchings of actually exposed LCD screens or the overlay deviation between layers can be minimized.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

The present invention is applied to a projection exposure apparatus for production of a liquid crystal display (LCD).

Figure 1:
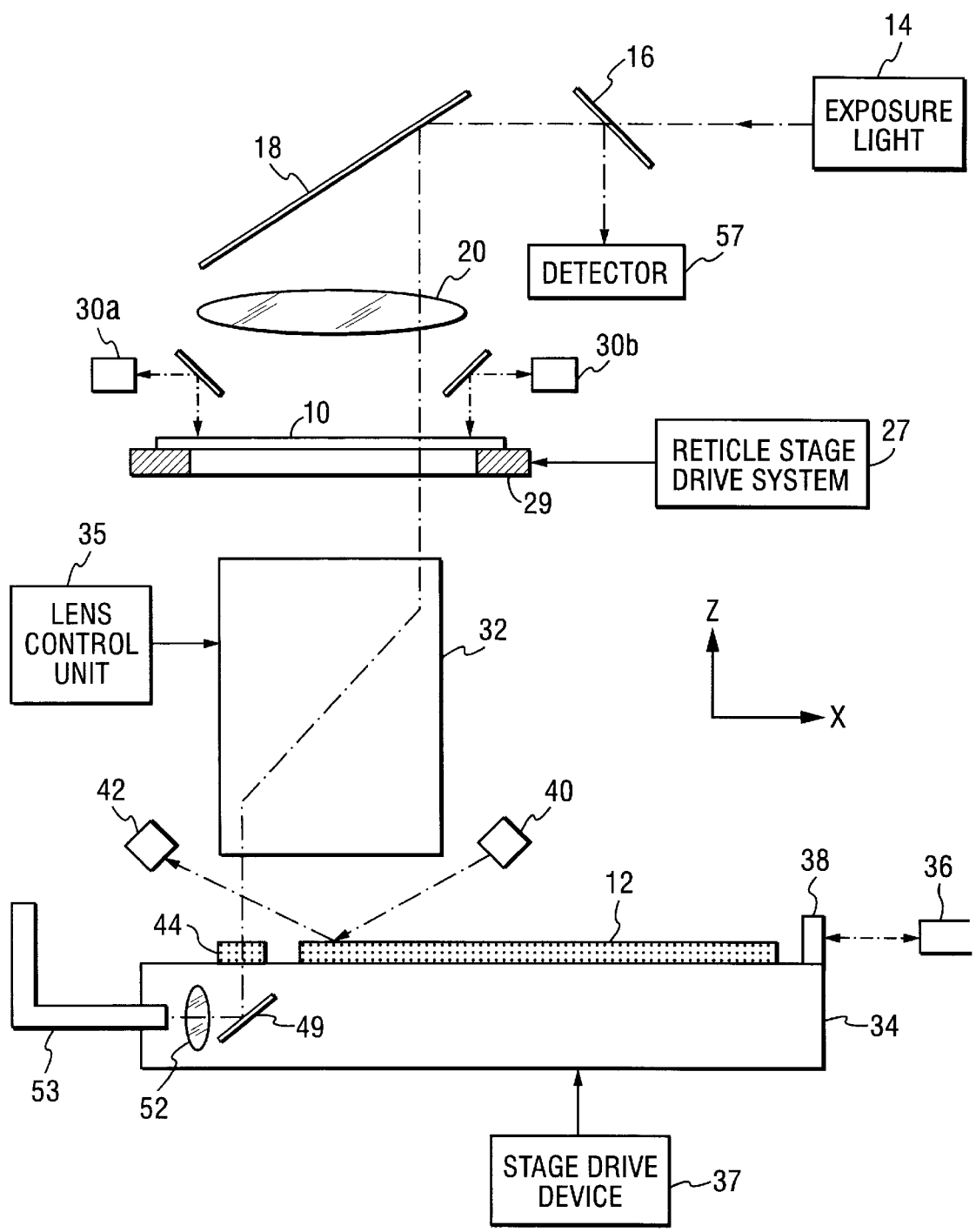
FIG. 1 is a conceptual diagram (elevational view) illustrating the construction of a projection exposure apparatus for producing LCD displays according to an embodiment of the present invention.

FIG. 1 schematically illustrates a projection exposure apparatus for LCDs according to this embodiment. In this projection exposure apparatus, an image of a pattern of a reticle 10 is transferred onto a glass substrate 12. The construction of the projection exposure apparatus for LCDs according to this embodiment will be described hereinafter following its optical path. After illumination light emitted from an exposure light source 14 is subjected to illuminance uniformization by a fly eye lens (not shown), an effective exposure area on the reticle 10 is illuminated with the illumination light at a uniform illuminance through a beam splitter 16, a mirror 18 and a condenser lens 20. Illumination light outputted from the exposure light source 14 is light that contains wavelengths of g-rays, h-rays of an extra-high-pressure mercury lamp and the like for which a photoresist applied to the glass substrate 12 has a sensitivity, and required optical characteristics, such as resolution, illumination uniformity and the like, are reliably provided in the effective exposure area on the reticle 10.

Figure 2:
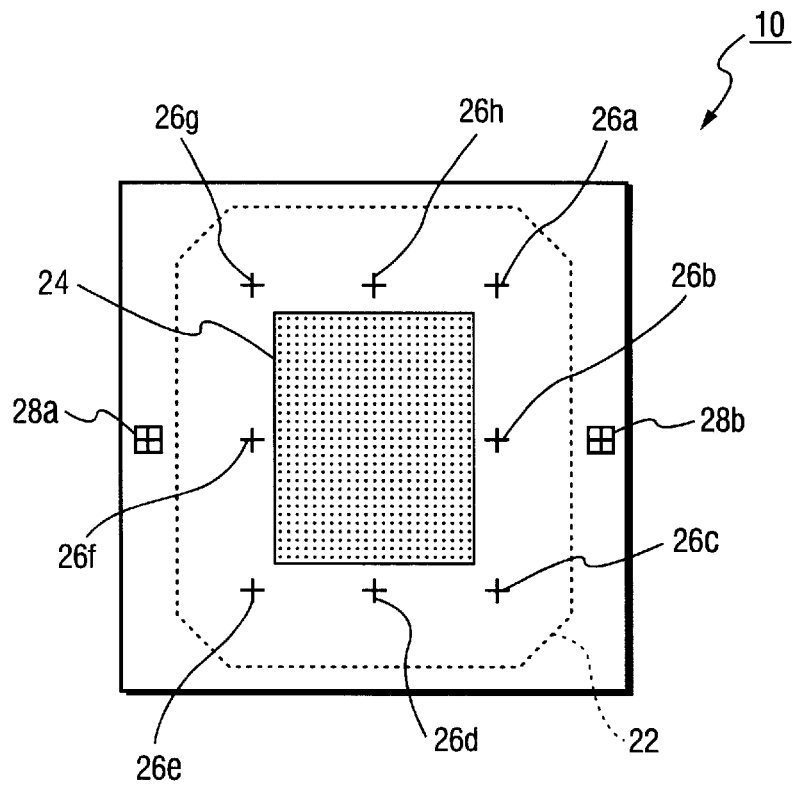
FIG. 2 is a plan view of an LCD-production reticle used in the embodiment shown in FIG. 1.

FIG. 2 indicates an arrangement of a pattern of the reticle 10. As shown in the figure, an LCD pattern 24 is formed in a substantially central portion of an effective exposure area 22 on the reticle 10, and eight coordinate measurement marks (26a, 26b, 26c, 26d, 26e, 26f, 26g, 26h) are formed at the outside of the LCD pattern 24. Two alignment marks 28a, 28b for aligning the reticle 10 are formed at the outside of the effective exposure area 22. The coordinate measurement marks (26a–26h) are generally rectangular opening patterns elongated in non-measurement directions in substantially the same shape as slit marks (see FIG. 3) described below.

Referring back to FIG. 1, the reticle 10 is placed on a reticle stage 29 that is movable on an XY coordinate system (a two-dimensional coordinate system perpendicular to the optical axis of a projection lens 32) by a reticle stage drive system 27. Reticle alignment systems 30a, 30b are disposed at sides of the reticle 10. The reticle alignment systems 30a, 30b detect the alignment marks 28a, 28b (see FIG. 2) on the reticle 10, respectively, and the reticle stage 29 is driven by the reticle stage drive system 27 to align the reticle 10 at a predetermined position in the XY coordinate system.

Illumination light passing through the reticle 10 reaches the glass substrate 12 placed on an XY stage 34 through the projection lens 32 having predetermined optical characteristics. The XY stage 34 is designed to be movable two-dimensionally in an XY coordinate system by a stage drive device 37. A moving mirror 38 that reflects laser light from a laser interferometer 36 is secured on the XY stage 34. By the laser interferometer 36, coordinates in the XY coordinate system of the XY stage 34 can be accurately measured. Although the figure shows only the interferometer system (36, 38) for measuring position in the X direction on the XY stage 34 for convenience in illustration, another interferometer system is actually provided for measuring position in the Y direction.

Disposed below the projection lens 32 is an oblique-incidence type automatic focusing system (40, 42) whereby positioning is performed such that a surface of the glass substrate 12 is always at a predetermined position in the direction of the optical axis of the projection lens 32. That is, the XY stage 34 is driven in a Z direction (direction parallel to the optical axis of the projection lens 32) so that a to-be-exposed surface of the glass substrate 12 coincides with the focal plane of the projection lens 32. A lens control unit 35 for adjusting the magnification of the projection lens 32 is disposed at a side of the projection lens 32. The lens control unit 35 controls the magnification of the projection lens 32 by, for example, adjusting the air pressure between lens elements that constitute the projection lens 32.

Figure 3:
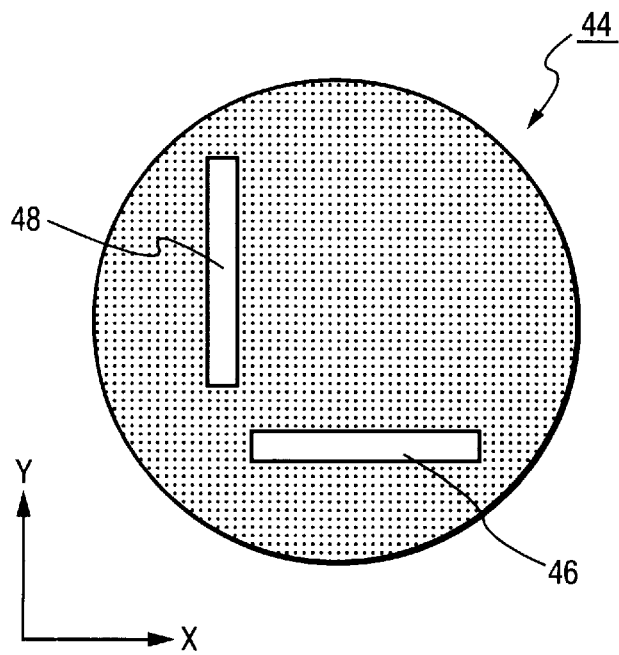
FIG. 3 is a plan view of a glass member for measuring position of the reticle, used in the embodiment shown in FIG. 1.

A disk-shaped glass member 44 is disposed on the XY stage 34, at a position that substantially coincides with the surface of the glass substrate 12 in the direction of the optical axis of the projection lens 32. The glass member 44 is provided with generally rectangular opening slit marks 46, 48, as shown in FIG. 3, that are elongated in the X and Y directions, respectively. A mirror 49 and a condenser lens 52 are disposed below the glass member 44 within the XY stage 34. Thereby, the glass member 44 is illuminated from below with illumination light (exposure light) transmitted through an optical fiber 53, via the condenser lens 52 and the mirror 50.

Figure 4:
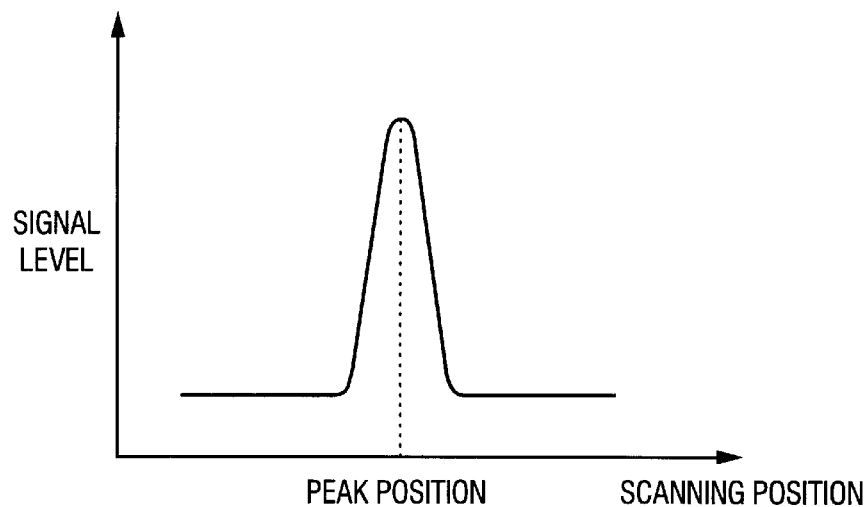
FIG. 4 is a graph for illustration of operation during position measurement of the reticle according to the embodiment shown in FIG. 1.

Images of the slit marks 46, 48 of the glass member 44 are reversely projected onto the reticle 10 through the projection lens 32. The light flux passing through the reticle 10 strikes the beam splitter 16, via the condenser lens 20 and the mirror 18. Light incident on the beam splitter 16 is reflected therefrom and strikes a detector 57. The detector 57 (photoelectric conversion element) outputs an electric signal in accordance with the intensity of input light. More specifically, when the slit marks 46, 48 are scanned relative to the coordinate measurement marks (26a–26h) of the reticle 10 in a measurement direction (direction of width of the marks), the detector 57 outputs a signal having a level as indicated in FIG. 4, corresponding to the coordinates of the slit marks 46, 48 measured by the laser interferometer 36. The coordinates corresponding to the minimum value of the curve in FIG. 4 represent positions where the slit marks 46, 48 coincide with the coordinate measurement marks (26a–26h). Thereby, coordinates of the coordinate measurement marks (26a–26h) can be measured. Hereinafter, the arrangement (44, 49, 52, 53, 57, etc.) for measuring positions of the marks (26a–26h) in the reticle 10 using the slit marks 46, 48 in the glass member 44 as described above is collectively referred to as "position measurement apparatus".

There are cases where the coordinates of the coordinate measurement marks (26a–26h) of the reticle 10 measured by the position measurement apparatus (44, 49, 52, 53, 57, etc.) differ from the coordinates on the glass substrate 12 to which images of these marks (26a–26h) are transferred through the projection lens 32. This is because the transfer of images of the marks (26a–26h) of the reticle 10 onto the glass substrate 12 and the transfer of mark images formed on the glass substrate 12 back to the reticle 10 differ in optical aberrations of the projection lens 32 such as curvature of image field and the like. Therefore, it is necessary to correct measurements provided by the position measurement apparatus (44, 49, 52, 53, 57, etc.) described above, in order to precisely determine positions on the glass substrate 12 to which images of the coordinate measurement marks (26a–26h) of the reticle 10 are transferred.

Figure 5:
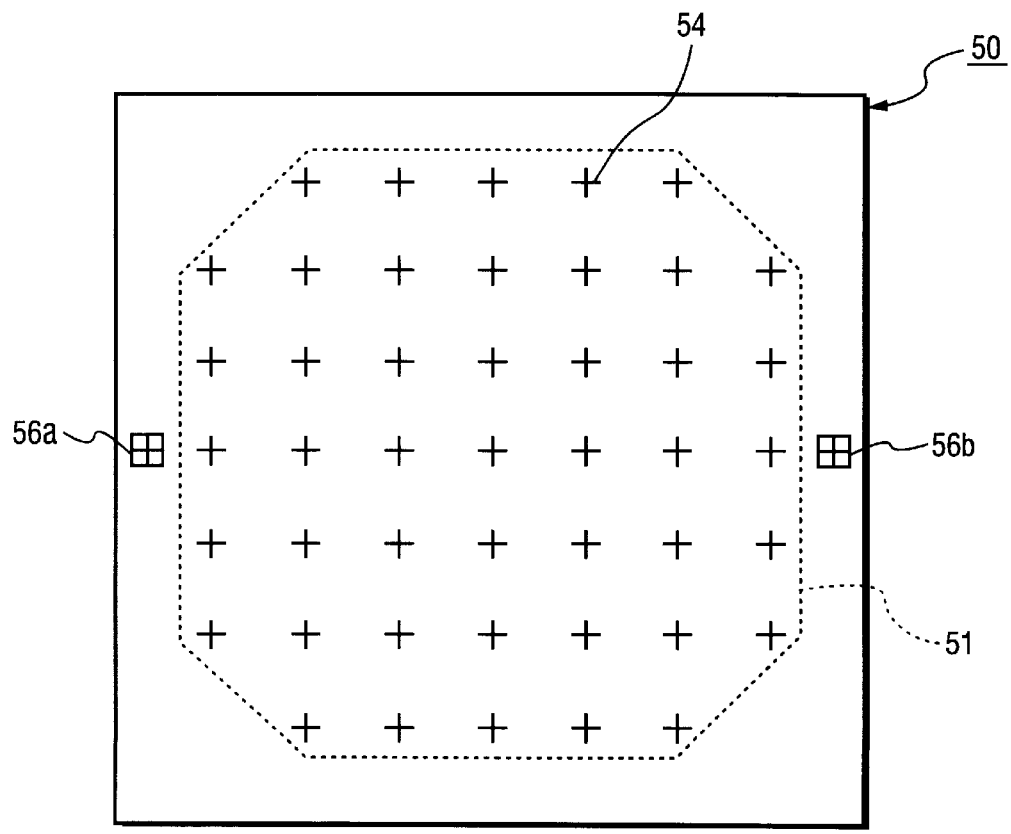
FIG. 5 is a plan view illustrating the pattern configuration of a correction reticle used in the embodiment shown in FIG. 1.

For that purpose, this embodiment uses a correction reticle 50 as shown in FIG. 5 to prepare data for correcting measured values provided by the position measurement apparatus (44, 49, 52, 53, 57, etc.). Within an effective exposure area 51 on the correction reticle 50, a plurality of cells 54 (see FIG. 6) for position detection are formed and arranged in the form of a matrix. Furthermore, formed outside the effective exposure area 51 are alignment marks 56a, 56b which are detected by the aforementioned reticle alignment systems 30a, 30b.

Figure 6:
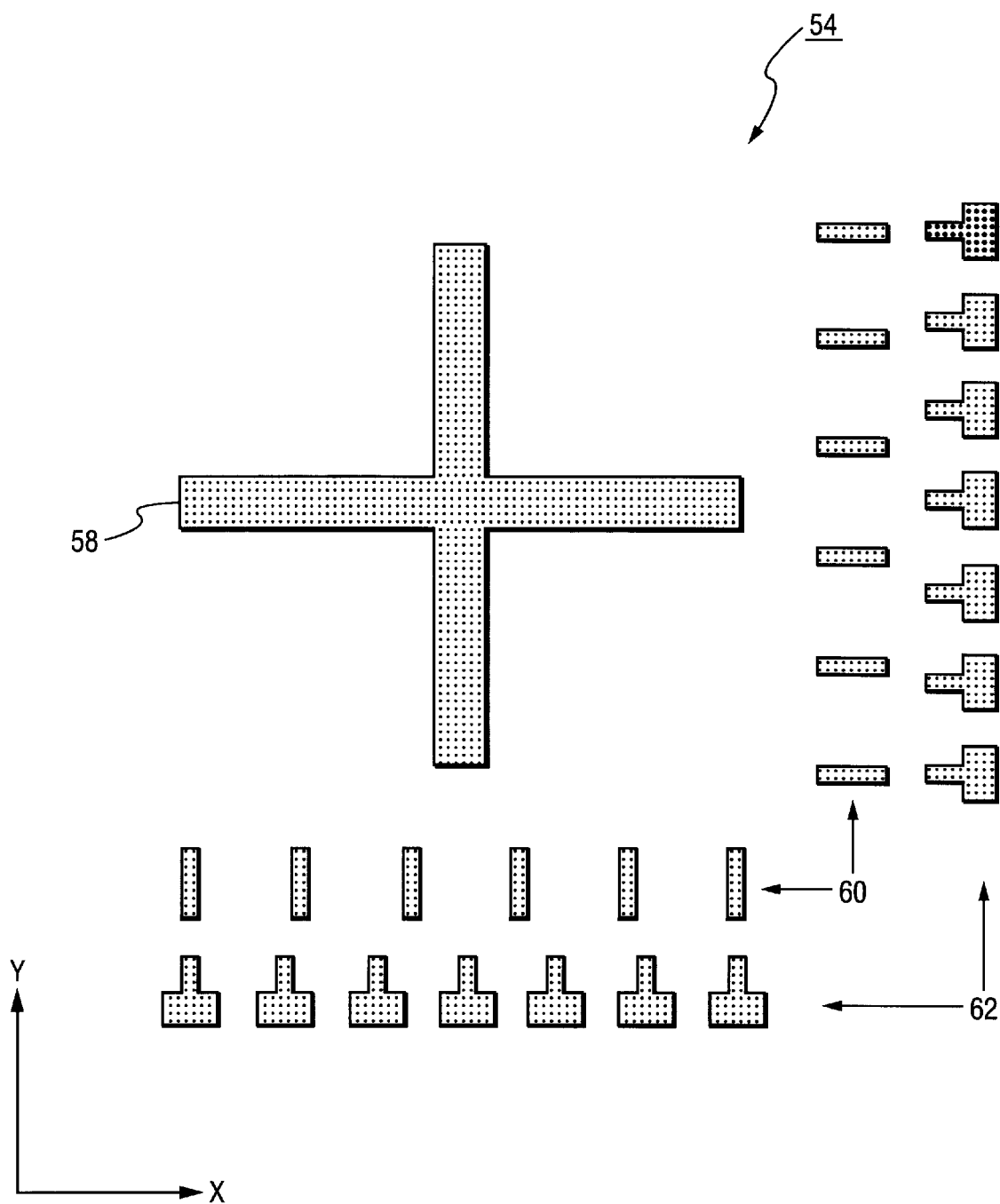
FIG. 6 is an enlarged plan view of portions (a coordinate measurement mark and vernier patterns) of the correction reticle shown in FIG. 5.

A cell 54 is constituted, as shown in FIG. 6, by a coordinate measurement mark 58 which can be measured by the position measurement apparatus (44, 49, 52, 53, 57, etc.), and vernier patterns (60, 62) which are transferred onto the glass substrate 12 by exposure to measure the transferred positions. The vernier patterns (60, 62) are made up of main scale patterns 60 and auxiliary scale patterns 62. By optical-microscopically observing patterns formed of the main scale patterns 60 and the auxiliary scale patterns 62 superimposed on each other by exposure, positions on the glass substrate 12 to which images of the patterns of the reticle are transferred can be measured.

The position of the coordinate measurement mark 58 in a cell 54 and the position of the vernier patterns (60, 62) in the same cell 54 differ in the amount of optical aberrations such as distortion of the projection lens 32, due to a difference in image height. Therefore, the interval between the coordinate measurement mark 58 and the vernier patterns (60, 62) in each cell 54 is reduced to an extent such that the difference in optical aberrations becomes ignorable. That is, if the correction reticle 50 is formed such that the position of the coordinate measurement mark 58 and the position of the vernier patterns (60, 62) in each cell 54 are closer to each other, the correction precision can be improved.

Figure 7:
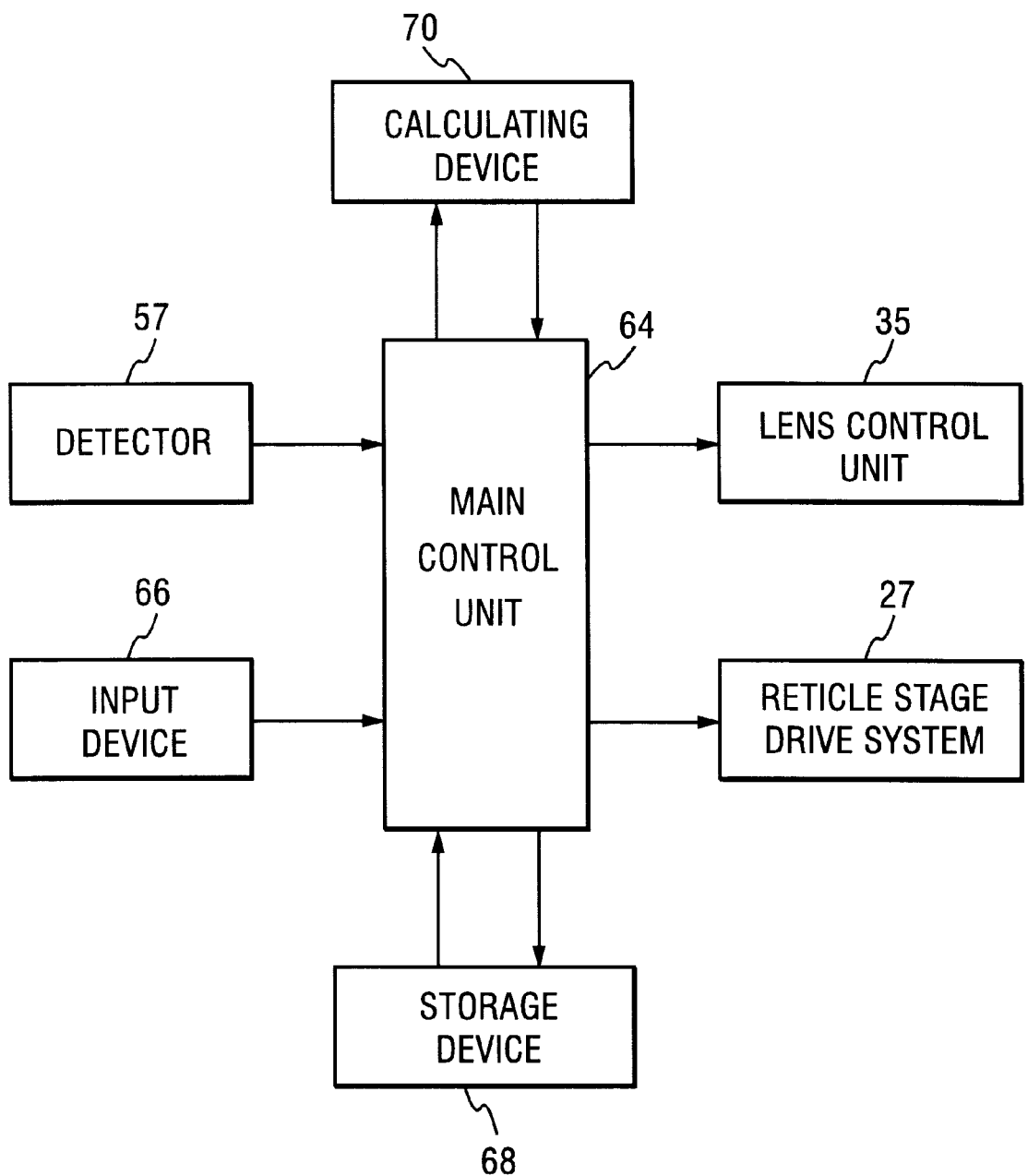
FIG. 7 is a block diagram illustrating the construction of a control system (for reticle alignment) according to the embodiment shown in FIG. 1.

FIG. 7 illustrates the construction of a control system in relation to position measurement of the reticle 10 in the projection optical system according to this embodiment. This control system is generally controlled by a main control unit 64. The main control unit 64 is supplied with, as input data, an output signal of the detector 57 and a signal from an input device 66. The output signal from the detector 57 is positional information regarding the coordinate measurement marks (26a–26h) of the reticle 10 provided by the position measurement apparatus (44, 49, 52, 53, 57, etc.) as described above. Inputted from the input device 66 is information regarding an error between a measured value M1 measured by the position measurement apparatus (44, 49, 52, 53, 57, etc.) using the correction reticle 50 and an actual transferred position M2. The main control unit 64 is connected with a storage device 68 and a calculating device 70. The storage device 68 stores data such as a correction table described below. The calculating device 70 performs predetermined calculation under control of the main control unit 64. The main control unit 64 is designed to control the lens control unit 35 and the reticle drive system 27 on the basis of information from the storage device 68 and the calculating device 70.

The operation for magnification correction of the projection lens 32 and positional correction of the reticle stage 29 at the time of exposure will be described in detail below with reference to FIGS. 8–12. First, in step SP1, correction amounts for measured values of the reticle measured by the position measurement apparatus (44, 49, 52, 53, 57, etc.) relative to actual transferred positions on the substrate 12 are determined. That is, a deviation amount $\Delta M$ (=M2—M1) between the measured value M1 of each coordinate measurement mark 58 of the correction reticle 50 and each transferred position M2 on the glass substrate 12 is determined with respect to a plurality of representative points within the effective exposure area of the reticle 50. Then, based on the deviation amounts $\Delta M$, a correction table is prepared.

Figure 9:
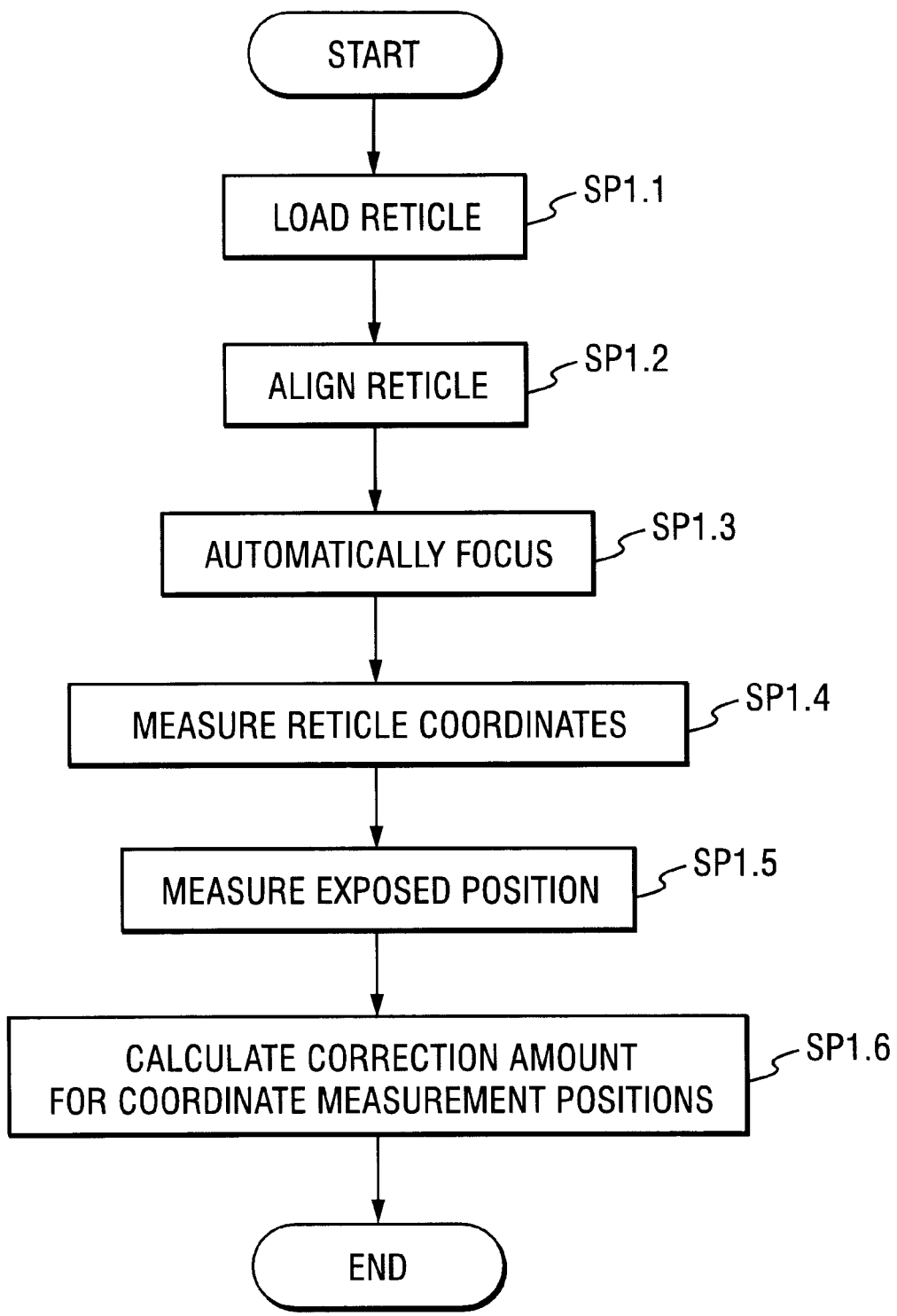
FIG. 9 is a flowchart illustrating the sequence of a portion (preparation of a correction table) of the flowchart of FIG. 8.

Step SP1 includes steps SP1.1–SP 1.6 illustrated in FIG. 9. In step SP1.1, first, the correction reticle 50 is loaded onto the reticle stage 29. Then, in step SP1.2, position alignment of the correction reticle 50 is performed by the reticle alignment systems 30a, 30b and the reticle drive system 27 using the alignment marks 56a, 56b Then, in step SP1.3, the glass member 44 and the glass substrate 12 are aligned to positions conjugate with the reticle in the direction of the optical axis of the projection lens 32 using the automatic focusing system (40, 42). Then, in step SP1.4, the slit marks 46, 48 of the glass member 44 are scanned sequentially relative to the individual coordinate measurement marks 58 of the correction reticle 50, and coordinates (positions) of these marks 58 are measured using the position measurement apparatus (44, 49, 52, 53, 57, etc.). The thus-determined coordinates M1 are supplied through the detector 57 to the main control unit 64.

Subsequently, in step SP1.5, the alignment condition of the correction reticle 50, the same as the condition in step SP1.4 is maintained, and positions (coordinates) M2 of actual exposure to an image of the correction reticle 50 are determined using the vernier patterns (60, 62). In detail, the glass substrate 12 is first exposed to the entire area of the effective exposure area of the correction reticle 50 by one shot. Then, exposure is sequentially performed in such a manner that auxiliary scales 62 of vernier patterns on the optical axis (reticle center) of the projection lens 32, where there is no optical aberration (distortion), are aligned to the desired positions of the main scales of individual verniers by stepping the XY stage 34. Then, the patterns of main scales 60 and auxiliary scales 62 thus superimposed by exposure are observed by an optical microscope to measure transferred positions M2 of the reticle 50. The thus-measured positions (coordinates) M2 are supplied through the input device 66 to the main control unit 64.

After that, in step SP1.6, the calculating device 70 calculates the difference $\Delta M$ between the coordinates M1 of the correction reticle 50 measured by the position measurement apparatus (44, 49, 52, 53, 57, etc.) and the transferred positions M2 of the correction reticle 50 on the glass substrate 12 measured by actually performing exposure. Then, a correction table in which, with regard to a plurality of representative points in the effective exposure area 51, correction values $\Delta M$ for the coordinate measurement values M1 by the position measurement apparatus (44, 49, 52, 53, 57, etc.) relative to the transferred positions on the glass substrate 12 are arranged in the form of a map, is prepared using the calculating device 70.

A case where offset is given to the measured values of marks due to an alignment error of the correction reticle 50 will be considered below. In this case, it can be considered that the same amount of offset is given to the coordinate measurement mark 58 and the vernier patterns (60, 62) in a cell 54. The measured values M1 provided by the position measurement apparatus (44, 49, 52, 53, 57, etc.) and the measured values M2 of transferred positions determined using the vernier patterns (60, 62) are expressed as in equation (1) and equation (2), where m1, m2 represent values when no offset is given to the measured values M1, M2, and OF represents an amount of offset given to the measured values.

$$M1 = m1 + OF \quad (1)$$

$$M2 = m2 + OF \quad (2)$$

The difference $\Delta m$ between the coordinate measurement value m1 and the measured value m2 of transferred position is expressed as in equation (3), indicating that the difference $\Delta m$ is not affected by alignment error of the correction reticle 50 or the reticle 10.

$$\Delta m = (M2 - OF) - (M1 - OF) = M2 - M1 \quad (3)$$

Figure 8:
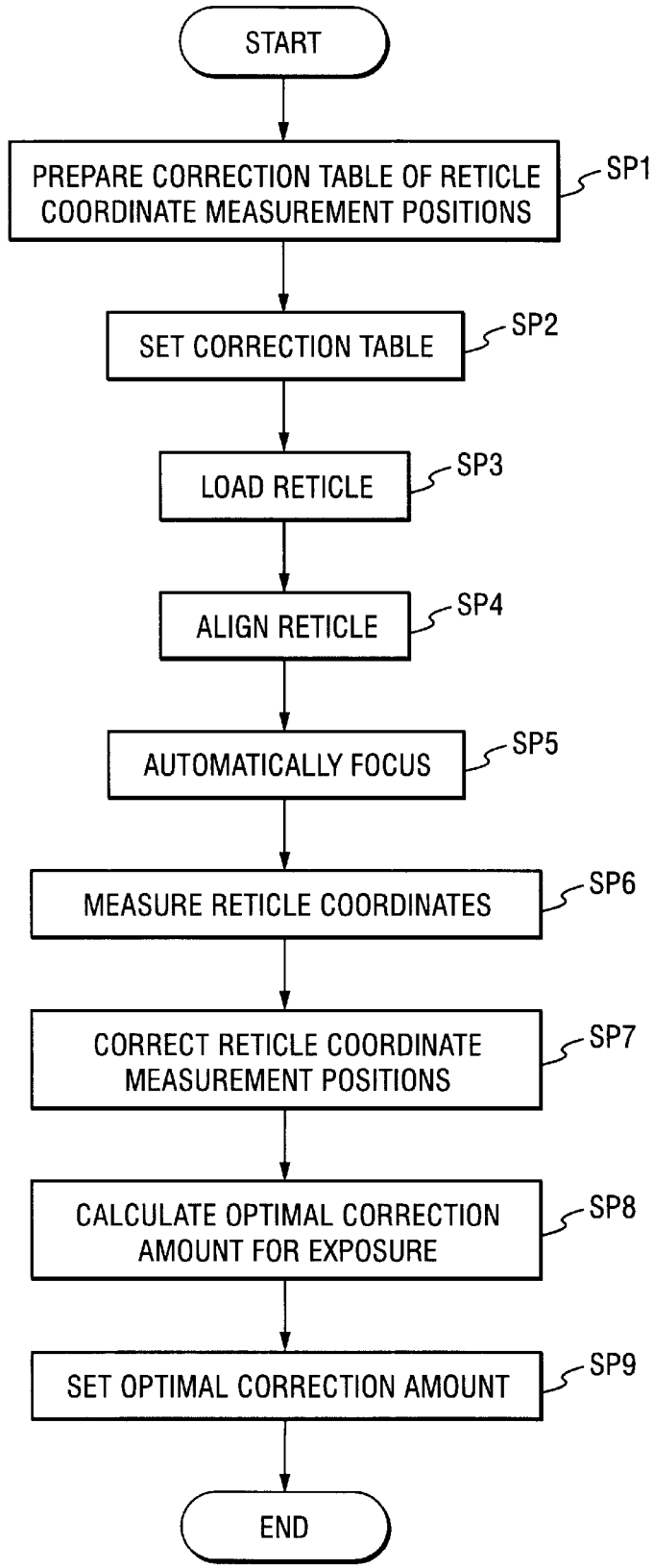
FIG. 8 is a flowchart illustrating the overall operation of reticle alignment according to the embodiment shown in FIG. 1.

Referring back to the flowchart of FIG. 8, in step SP2, the correction table prepared as described above is set in the apparatus. That is, the correction table is stored in the storage device 68 by the main control unit 64. Subsequently, in step SP3, a reticle 10 for producing an LCD is loaded onto the reticle stage 29. Then, in step SP4, alignment of the LCD-production reticle 10 is performed using the alignment marks 28a, 28b (see FIG. 2) of the reticle 10. Then, in step SP5, the glass member 44 is aligned to a position conjugate in the direction of the optical axis of the projection lens 32 using the automatic focusing system (40, 42).

After that, in step SP6, coordinates M3 of the coordinate measurement marks (26a–26h) of the reticle 10 are measured using the position measurement apparatus (44, 49, 52, 53, 57, etc.). Then, in step SP7, transferred positions M4 of the coordinate measurement marks (26a–26h) of the reticle 10 on the glass substrate 12 are determined in a procedure illustrated in FIG. 10 using the correction table stored in the storage device 68.

Figure 10:
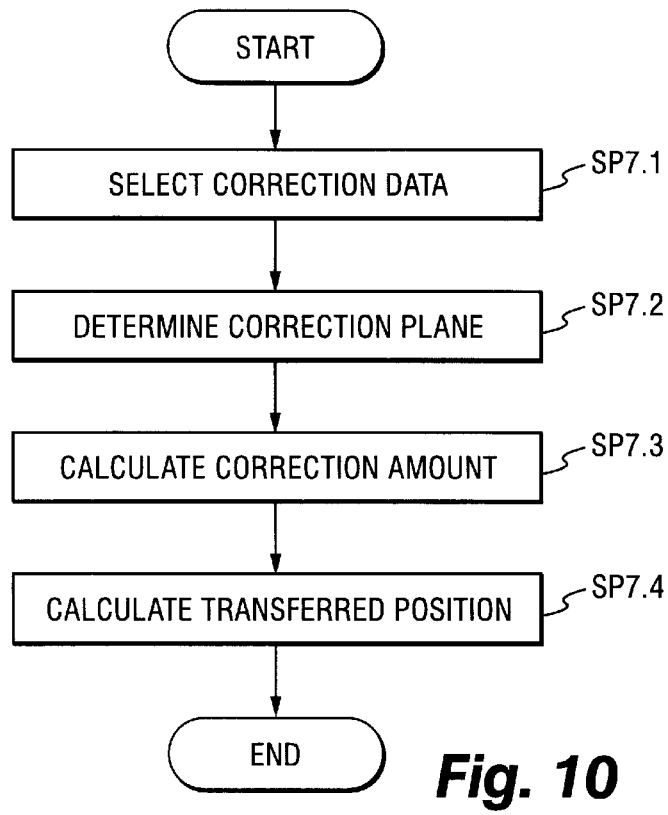
FIG. 10 is a flowchart illustrating the sequence of a portion (correction of reticle coordinate measurement position) of the flowchart of FIG. 8.
Figure 11:
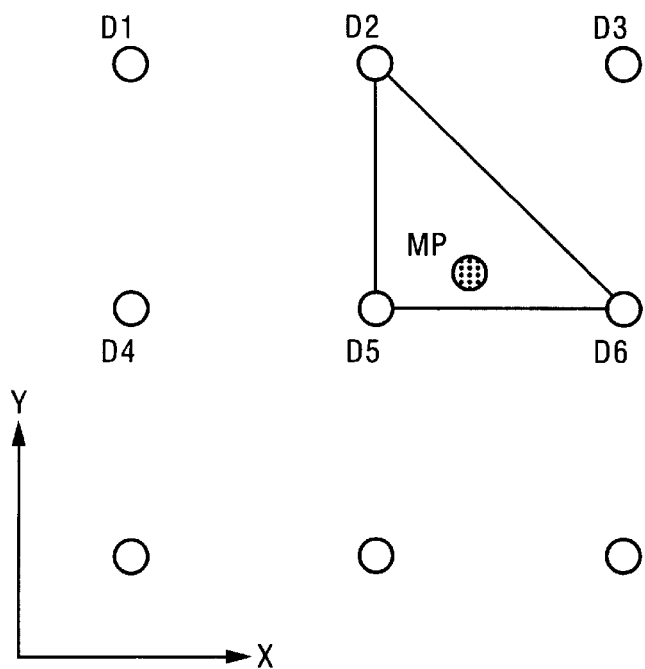
FIG. 11 is a diagram illustrating a correction data selecting method according to the embodiment shown in FIG. 1.
Figure 12:
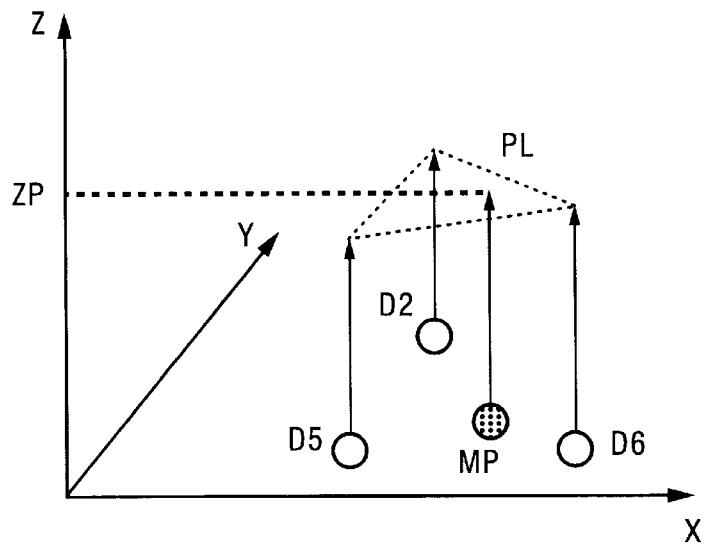
FIG. 12 is a diagram illustrating the correction data selecting method according to the embodiment shown in FIG. 1.
Figure 13:
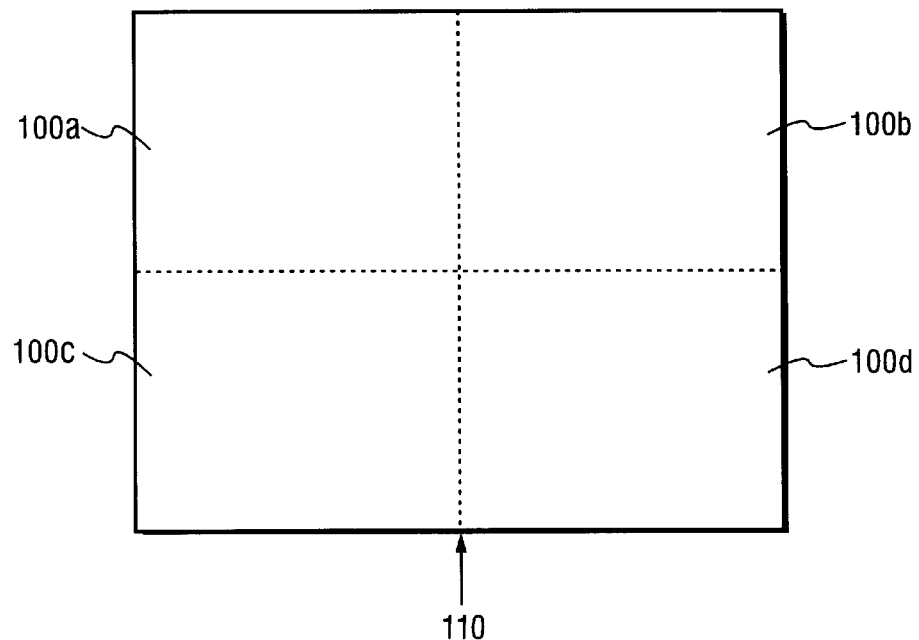
FIG. 13 is a diagram used for illustration of the background art of the present invention, illustrating an exposed pattern on a substrate.
Figure 14A:
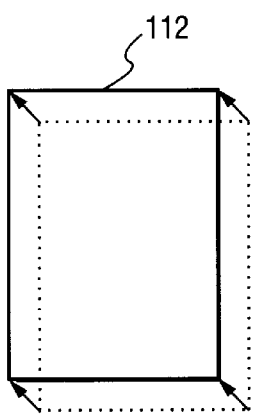
FIGS. 14(a)–(c) are diagrams used for illustration of the background art of the present invention, illustrating shifted states of a transferred pattern on a substrate.
Figure 14B:
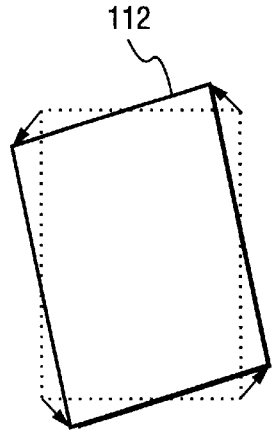
Figure 14C:
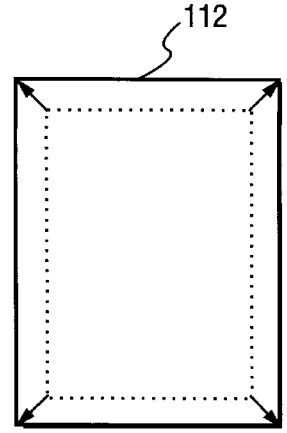
Figure 15:
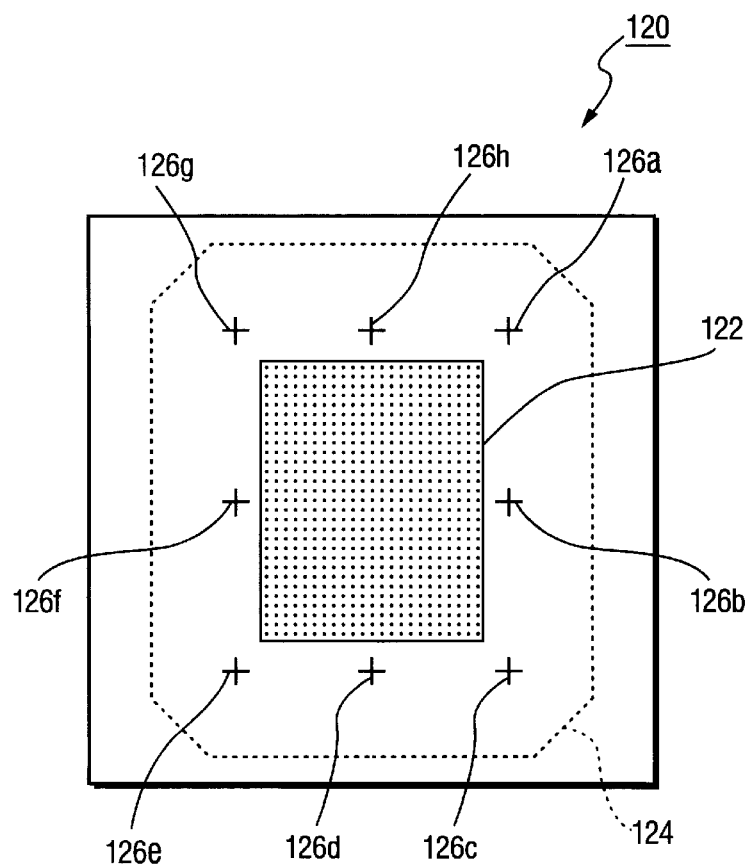
FIG. 15 is a diagram used for illustration of the background art of the present invention, illustrating arrangement of coordinate measurement marks and the like in a mask.

Referring to FIG. 10, first in step SP7.1, if data of positions corresponding to the positions of the individual coordinate measurement marks (26a–26h) is present in the correction table, that data ΔM is read out of the correction table in the storage device 68 by the main control unit 64. Conversely, if no position data corresponding to the positions of the individual coordinate measurement marks (26a–26h) is present in the correction table, the nearest three points in the data of the correction table are selected with respect to each coordinate measurement mark (26a–26h). For example, as indicated in FIG. 11, if correction data corresponding to a mark MP of the coordinate measurement marks (26a–26h) is to be determined, three correction data D2, D5, D6 near the mark MP are selected.

Subsequently, in step SP7.2, an XYZ space coordinate system is assumed (see FIG. 12) which comprises three quantities, that is, the coordinates of the selected three correction data D2, D5, D6 in the XY coordinate system and the coordinate measurement position correction amount Z at those positions. Then a plane PL extending through the three points selected in step SP7.1 in the coordinate system is determined. In step SP7.3, a correction amount ΔM for coordinate measurement position is determined from a position in that plane corresponding to the XY coordinates of the coordinate measurement mark MP.

Finally, in step SP7.4, the selected correction amount ZP is given to the position of the coordinate measurement mark MP measured by the position measurement apparatus (44, 49, 52, 53, 57, etc.), thereby determining a transferred position of the coordinate measurement mark MP. In relation to step SP7.1, where three points near the position of a coordinate measurement mark MP are selected from the data of the correction table, the interpolation precision of correction amount can be improved by increasing the number of cells 54 in the correction reticle 50 to reduce the pitch between the cells 54. Furthermore, although a correction plane is considered in step SP7.2, it is permissible to consider an n-dimensional curved surface and determine a correction amount by means of, for example, least square approximation.

By the method as described above, correction data ΔM is determined with respect to a plurality of points of the coordinate measurement marks (26a–26h) of the LCD-production reticle 10. Using the correction data ΔM, the measured coordinates M3 of the reticle 10 previously determined by the position measurement apparatus (44, 49, 52, 53, 57, etc.) are corrected, and transferred positions (coordinates) M4 on the glass substrate 12 are calculated.

Then, in step SP8, correction amounts (reticle shift, reticle rotation, magnification) at the time of exposure are calculated from differences between the transferred positions of the coordinate measurement marks (26a–26h) and the desired values M5 to which the marks are transferred, using means such as least square approximation. Such calculation of correction amounts is performed by the calculating device 70. Finally, in step SP9, the correction amount at the time of exposure is set in the apparatus. That is, the magnification of the projection lens 32 is adjusted by the main control unit 64 controlling the lens control unit 35, and the reticle 10 is aligned in position by controlling the reticle stage drive system 27. After that, an image 24 of the pattern of the reticle 10 is transferred onto an exposure area on the glass substrate 12 through the projection lens 32. After exposure using one reticle 10 is completed, the operation in step SP3 in FIG. 8 and the following steps is repeated using a new reticle, thereby performing exposure of other areas of the glass substrate 12 to complete exposure of the entire glass substrate 12.

As described above, this embodiment measures positions M1 of a plurality of marks 54 formed in the correction reticle 50, and determines transferred positions of the marks 54 of the correction reticle 50 by actually transferring these marks 54 onto the glass substrate 12, and determines position correction amounts for the measured positions M1 relative to the transferred positions M2 as correction data (correction table). That is, since correction data is calculated with reference to the reticle positions M2 determined through actual performance of exposure, the embodiment is able to obtain correction data ΔM corresponding to the conditions at the time of actual exposure. That is, the embodiment is not affected by changes in optical aberrations, such as curvature of image field, due to variations in the projecting direction through the projection lens 32.

Then, prior to performance of actual exposure operation using a reticle 10 for producing an LCD, positions M3 of a plurality of coordinate measurement marks (26a–26h) formed in the reticle 10 are measured, and transferred positions M4 of the reticle 10 are calculated by correcting the measured positions M3 of the reticle 10 on the basis of the previously determined correction data ΔM. Based on the thus-determined transferred positions M4 of the reticle 10, position alignment of the reticle 10 is performed. Therefore, the positional deviation at stitchings of actually exposed LCD screens and the overlay deviation between layers can be minimized.

While embodiments of the present invention have been described above, the present invention is not limited to these embodiments but may be modified or changed in various manners without departing from the gist of the present invention as a technical idea described in the claims.

We claim:

1. A position measurement method for measuring a position of an exposure mask prior to transfer of an image of a pattern formed on the exposure mask onto a photosensitive substrate through a projection optical system, the position measurement method comprising:

(a) measuring as a first position a position of a plurality of correction marks formed in a correction mask;

(b) transferring a plurality of the correction marks onto the photosensitive substrate and determining as a second position a transferred position of the plurality of correction marks;

(c) determining an amount of deviation of the first position from the second position as correction data and storing the correction data as a correction map corresponding to a position of each of the correction marks;

(d) measuring as a third position a plurality of exposure marks formed in the exposure mask; and (e) correcting the third position based on the correction map.

2. A method according to claim 1, wherein if a correction data corresponding to a particular exposure mark formed in the exposure mask is absent from the correction map, step (c) is performed by using a plurality of correction data near the particular exposure mark within the correction map.

3. A method according to claim 1, wherein steps (a) and (d) are performed by (f) photoelectrically detecting on a reticle side of the projection optical system an image of a pattern formed on a substrate side of the projection optical system through the projection optical system.

4. A method according to claim 3, further comprising determining coordinates of the correction marks and the exposure marks in accordance with step (f).

5. An exposure method for transferring an image of a pattern formed in an exposure mask onto a photosensitive substrate through a projection optical system, the exposure method comprising:

(a) measuring as a first position a position of a plurality of correction marks formed in a correction mask;

(b) transferring a plurality of the correction marks onto the photosensitive substrate and determining as a second position a transferred position of the plurality of correction marks;

(c) determining an amount of deviation of the first position from the second position as correction data and storing the correction data as a correction map corresponding to a position of each of the correction marks;

(d) measuring as a third position a plurality of exposure marks formed in the exposure mask;

(e) correcting the third position based on the correction map;

(f) positioning the exposure mask based on the corrected third position; and (g) transferring the image of the pattern formed on the exposure mask onto the photosensitive substrate through the projection optical system.

6. A method according to claim 5, wherein if a correction data corresponding to a particular exposure mark formed in the exposure mask is absent from the correction map, step (c) is performed by using a plurality of correction data near the particular exposure mark within the correction map.

7. A method according to claim 5, wherein steps (a) and (d) are performed by (h) photoelectrically detecting on a reticle side of the projection optical system an image of a pattern formed on a substrate side of the projection optical system through the projection optical system.

8. A method according to claim 7, further comprising determining coordinates of the correction marks and the exposure marks in accordance with step (h).

9. A method according to claim 5, wherein the step of transferring the image uses a stitching technology.

10. A position measurement method for measuring a position of an exposure mask prior to transfer of an image of a pattern formed on the exposure mask onto a photosensitive substrate through a projection optical system, the position measurement method comprising:

(a) determining correction data based on a deviation between a measured position of a plurality of correction marks in a correction mask and a transferred position of the correction marks and storing the correction data as a correction map corresponding to a position of each of the correction marks;

(b) measuring a position of a plurality of exposure marks formed in the exposure mask; and (c) correcting the position of the exposure marks based on the correction map.

11. A method according to claim 10, wherein the measured position of the plurality of correction marks in step (a) is determined by reverse projecting images of slit marks formed in a plate, which is level with the photosensitive substrate in an optical axis direction, relative to the correction marks via the projection optical system to determine coordinates of the correction marks.

12. A method according to claim 11, wherein the transferred position of the plurality of correction marks in step (a) is determined by transferring an image of the correction marks onto the photosensitive substrate, and observing patterns of the images with an optical microscope.

13. A method according to claim 12, wherein the measured position of the plurality of exposure marks in step (b) is determined by reverse projecting images of slit marks formed in the plate relative to the exposure marks via the projection optical system to determine coordinates of the exposure marks.

14. A method according to claim 10, wherein if a correction data corresponding to a particular exposure mark formed in the exposure mask does not exist in the correction map, step (a) is performed by using a plurality of correction data near the particular exposure mark within the correction map.

* * * * *